(12) United States Patent
Nguyen et al.

(10) Patent No.: US 6,788,595 B2
(45) Date of Patent: Sep. 7, 2004

(54) EMBEDDED RECALL APPARATUS AND METHOD IN NONVOLATILE MEMORY

(75) Inventors: Hung Q. Nguyen, Fremont, CA (US); Sang Thanh Nguyen, Union City, CA (US); Loc B. Hoang, San Jose, CA (US); Tam M. Nguyen, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 49 days.

(21) Appl. No.: 10/213,243

(22) Filed: Aug. 5, 2002

(65) Prior Publication Data

US 2004/0022086 A1 Feb. 5, 2004

(51) Int. Cl.[7] .................................................. G11C 7/00
(52) U.S. Cl. ...................................... 365/200; 365/201
(58) Field of Search ................................. 365/200, 201, 365/185.01; 714/735, 738

(56) References Cited

U.S. PATENT DOCUMENTS

| | | | | |
|---|---|---|---|---|
| 5,289,411 A | * | 2/1994 | Jeng et al. ............. | 365/185.12 |
| 5,572,054 A | * | 11/1996 | Wang et al. ................. | 257/322 |
| 5,646,948 A | * | 7/1997 | Kobayashi et al. ......... | 714/719 |
| 6,067,262 A | * | 5/2000 | Irrinki et al. ................ | 365/201 |
| 6,442,085 B1 | * | 8/2002 | Fragano et al. ............. | 365/201 |
| 6,504,773 B2 | * | 1/2003 | Kobayashi ................... | 365/201 |

* cited by examiner

*Primary Examiner*—Anh Phung
(74) *Attorney, Agent, or Firm*—Gray Cary Ware & Freidenrich LLP

(57) ABSTRACT

Predetermined data is stored in first and second predetermined locations of a memory. The first location may be in a first part of the memory, and the second location may be in a redundant part of the memory. At power up or reset, the first predetermined location of the memory successively is read and compared to data stored in a register until the comparison indicates a match for a predefined number of consecutive reads and comparisons. The successive reading may be stopped if the number of comparisons indicating a failure equals another predefined number of times. The data stored in the second predetermined location also is read. This data may be compared to the data previously read from the second predetermined location. The reading and comparing from the first predetermined location and the reading from the second predetermined location are continued until the number of times data is read from the second predetermined location equals a third predetermined number. The voltage signal is then determined to be valid after sufficient successive reads of the first predetermined location of the memory.

35 Claims, 6 Drawing Sheets

US 6,788,595 B2

EMBEDDED RECALL APPARATUS AND METHOD IN NONVOLATILE MEMORY

BACKGROUND OF THE INVENTION

The present invention relates to a system and method for reading nonvolatile memory, and more particularly, to a system and method for reading nonvolatile memory at power up.

In an integrated circuit memory chip or a system using nonvolatile memory, some of the defect locations may be replaced with the redundant memory. Some information stored in nonvolatile memory is recalled prior to any operation. The redundancy can be stored in a register after power-up by recalling from a nonvolatile memory space. The power typically is at a stable predetermined voltage level before reads are performed. Conventional systems wait a predetermined time after power-up before recalling data from the nonvolatile memory to ensure proper reading.

SUMMARY OF THE INVENTION

The present invention provides a method for recalling data from a memory including said method embedded therein and such memory. The method may not wait a predetermined time after initiation, power reset or power up.

The present invention provides a method that reads data stored in a first location of a memory in response to or after an initiation signal, compares the read data and a predefined data pattern to determine whether there is a match, and repeats the reading and comparing in the event that said comparing determines consecutive matches less than a predetermined maximum number of matches. The method may further comprise providing an indication of valid power after said comparing determines consecutive matches equal to a predetermined maximum count. The method may further comprise reading data stored in a second location of the memory, and may further comprise such reading in the event said comparing determines consecutive matches equal to the predetermined maximum number of matches.

The method may further comprise reading data stored in a second location of the memory in the event said comparing determines consecutive matches equal to the predetermined maximum number of matches, and repeating the reading data stored in a first location, the comparing, and the reading data stored in a second location a predetermined number of times.

The present invention provides a memory device comprising a memory, a register, a comparator, and a counter. The register stores a predefined data pattern. The comparator commands a read from the memory and the register and generates a match signal indicating a match in the event the data read from a first location of the memory matches the predefined data pattern and indicating a non-match in the event the data read from the first location does not match the predefined data pattern in response to an initiation signal. The counter causes the comparator to command a read and generate the match signal in the event that the match signal does not indicate a match for predetermined number of consecutive reads.

DETAILED DESCRIPTION

Figure 1:
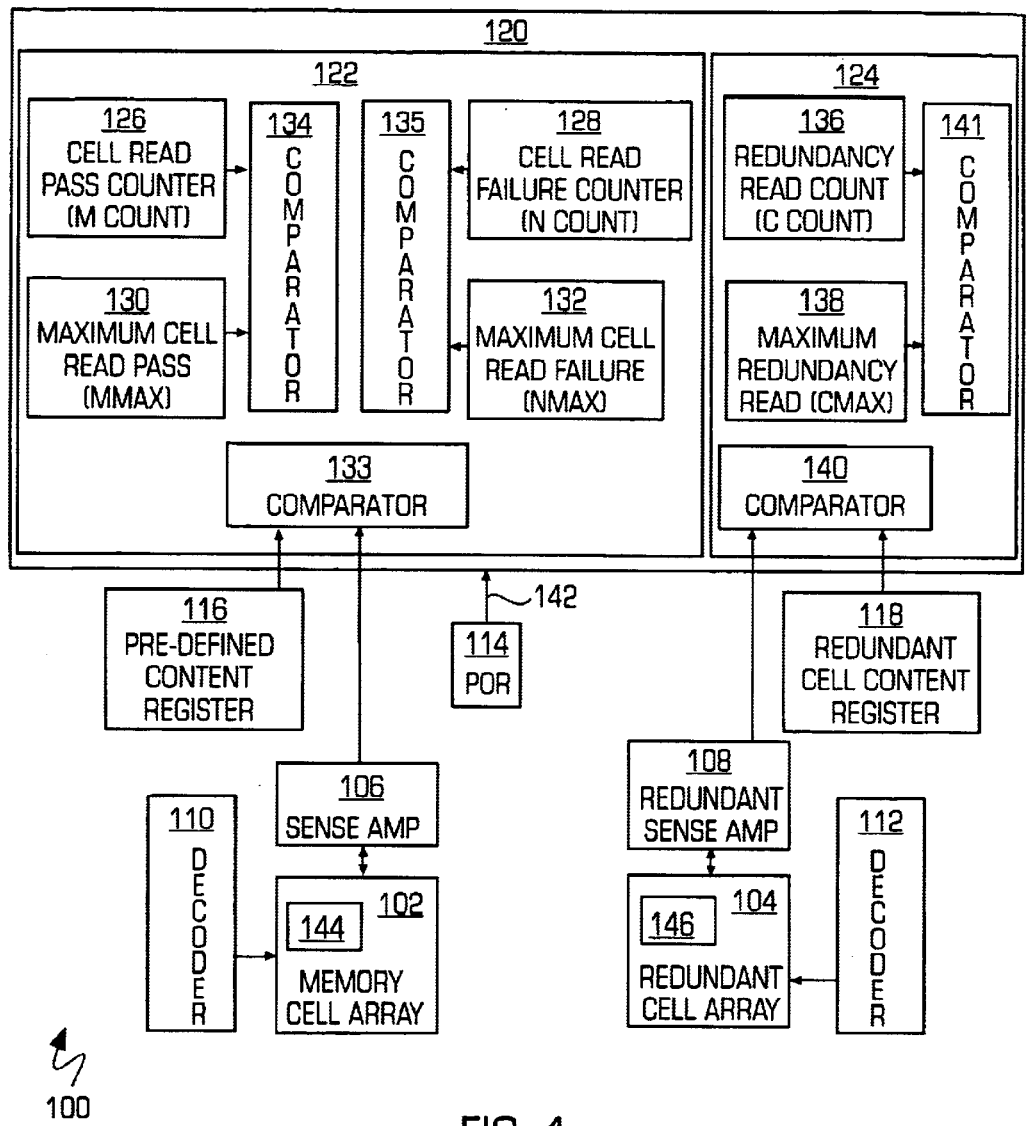
FIG. 1 is a block diagram illustrating a memory according to the present invention.

FIG. 1 is a block diagram illustrating a memory 100 according to the present invention.

The memory 100 comprises a memory cell array 102, a redundant cell array 104, a sense amplifier array 106, a redundant sense amplifier array 108, an array decoder 110, a redundant array decoder 112, a power-on reset (POR) circuit 114, a pre-defined content register 116, a redundant cell content register 118, and a power validation circuit 120. The power validation circuit 120 comprises a memory cell validation circuit 122 and a redundant cell validation circuit 124. The memory cell validation circuit 122 comprises a cell read pass counter 126, a cell read failure counter 128, a maximum cell read pass register 130, a maximum cell read failure register 132, and a plurality of comparators 133, 134, 135. The redundancy cell validation circuit 122 comprises a redundancy read counter 136, a maximum redundancy read register 138, and a plurality of comparators 140 and 141.

The memory cell array 102 and the redundant cell array 104 comprise a plurality of memory cells (not shown) which typically are arranged in rows and columns. The memory cell array 102 and the redundant cell array 104 may be, for example, a static random access memory, a dynamic random access memory, or a flash memory. The flash memory may include, for example, non-volatile floating gate memory cells. See, for example, U.S. Pat. No. 5,289,411, which is incorporated herein by reference. Non-volatile floating gate memory cells, arranged in an array of a plurality of rows and columns are well known in the art. One example of a type of non-volatile floating gate memory cell is a source side injection memory cell. See, for example, the memory cell disclosed in U.S. Pat. No. 5,572,054 which is incorporated herein by reference. Although the memory cell array 102 and the redundant cell array 104 are shown as separate arrays, they may be portions of the same array.

Address signals applied to the array decoder 110 and the redundant array decoder 112 are decoded for selecting memory cells in the memory cell array 102 or the redundant cell array 104, respectively. The sense amplifier array 106 and the redundant sense amplifier array 108 are coupled to the memory cell array 102 and the redundant cell array 104, respectively, for reading the contents of the selected memory cell. The power-on reset circuit 114 provides a power-on reset (POR) signal 142 to indicate that the power supply voltage applied to the memory 100 is higher than a certain voltage. In response to the power-on reset signal 142, the memory 100 initializes logic circuits therein before operation of the memory 100 begins. In another embodiment, an external circuit provides the power-on reset signal 142. In another embodiment, the power-on reset signal 142 is provided by applying a signal having a predetermined voltage, such as ground or Vdd, to a pin (not shown) of the memory 100. In another embodiment, an initiate signal is used for the memory validation.

The pre-defined content register 116 stores a pre-defined memory pattern Xn (e.g., AA55). The pre-defined memory pattern Xn is also stored in a predetermined location 144 in the memory cell array 102. In another embodiment, the memory 100 comprises a plurality of pre-defined content registers 116 for storing a plurality of pre-defined memory patterns. The comparator 133 compares the contents of the predetermined location 144 of the memory cell array 102 to the pre-defined memory pattern Xn stored in the pre-defined content register 116. The memory 100 may be initialized in an initialization procedure, such as described below in conjunction with FIG. 6. Such initialization procedure may store the pre-defined memory pattern Xn in the pre-defined content register 116 and in the predetermined location 144 of the memory cell array 102. In one embodiment, the pre-defined content register 116 is hardwired for storing the pattern Xn.

The redundant cell content register 118 stores data read from a predetermined location 146 of the redundant cell array 104. The data stored in the predetermined location 146 may be, for example, data Fn. In another embodiment, the memory 100 comprises a plurality of redundant cell content registers 118 for storing data read from a plurality of locations of the redundant cell array 104. The comparator 140 compares the contents of the predetermined location 146 of the redundant cell array 104 to the contents of the redundant cell content register 118. The initialization procedure may store the data in the predetermined location 146 of the redundant cell array 104.

The memory cell validation circuit 122 verifies the content of memory cells read during a power up sequence and processes memory validation routines. The cell read pass counter 126 counts a number (e.g., m) of times that a memory cell has passed a read verification. The maximum cell read pass register 130 stores a limit value (e.g., Mmax) for the number of read passes. The comparator 134 determines whether the read pass count equals the maximum cell read pass. The cell read failure counter 128 counts the number (e.g., n) of times that a memory cell fails a read verification. The maximum cell read failure register 132 stores a limit value (e.g., Nmax) for the number of read failures. The comparator 135 determines whether the read failure count equals the maximum cell failures.

The redundancy cell validation circuit 122 validates the read from the redundant cell array 104 and processes memory validation routines. The redundancy read counter 136 counts the number (e.g., c) of times that the redundancy cell array 104 has been read. The maximum redundancy read register 138 stores a limit value (e.g., Cmax) for the number of redundant cell reads. The comparator 141 determines whether the number of times the redundant cell array 104 has been read equals the limit value for the number of redundant cell reads.

Although the power validation circuit 120 is described as a circuit, the power validation circuit 120 may be implemented in software or a combination of hardware or software.

In another embodiment, another portion of the memory cell array 102 is used instead of a redundant cell array 104 for storing the pattern Fn.

Figure 2:
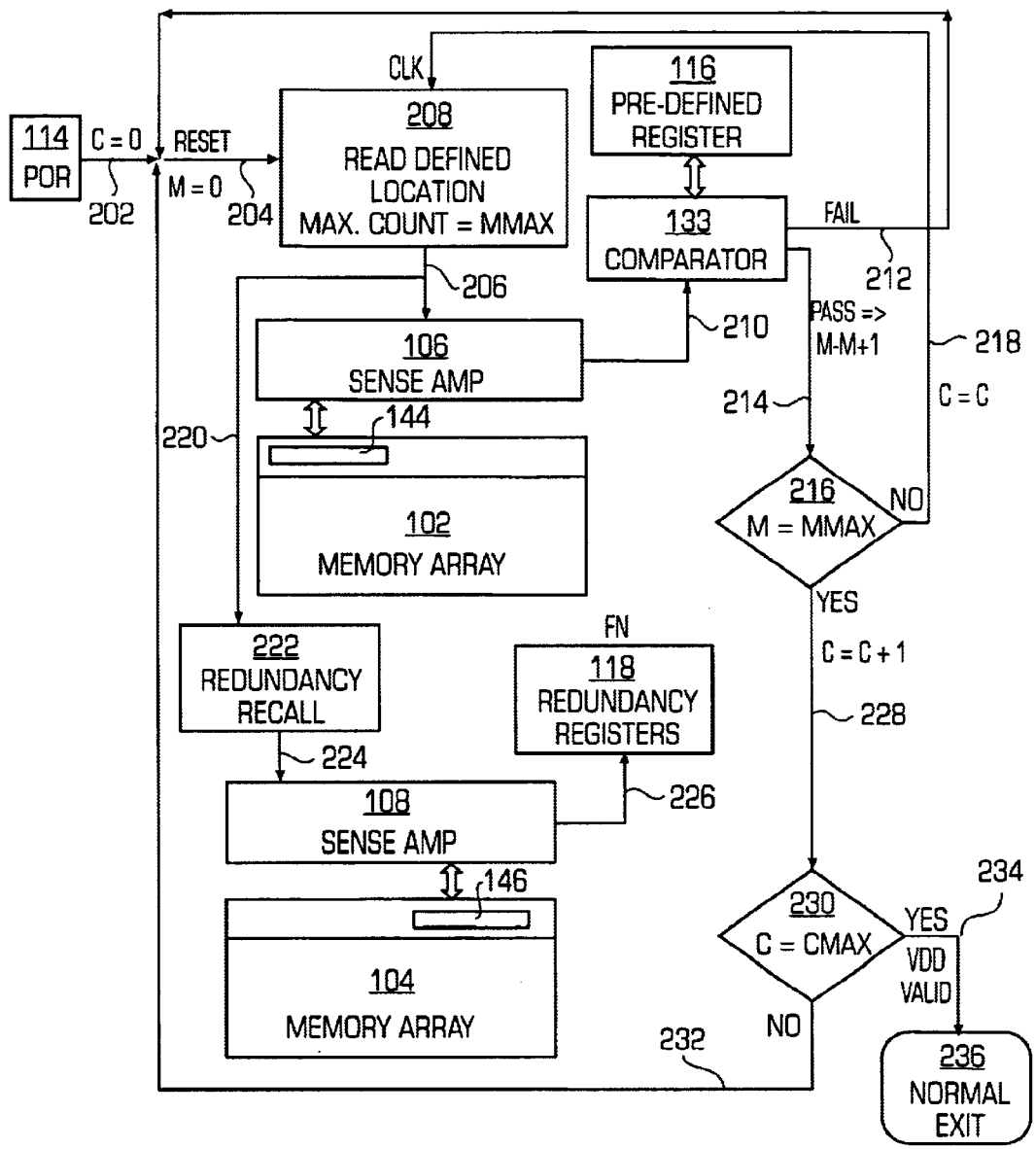
FIG. 2 is a signal control flow diagram illustrating a first memory validation procedure according to the present invention.

FIG. 2 is a signal control flow diagram illustrating a first memory validation procedure according to the present invention.

As noted above, data may be stored in the pre-defined content register 116, the predetermined location 144 of the memory cell array 102, and the predetermined location 146 of the memory cell array 104 via an initialization procedure.

As an overview, after sensing a power on reset signal 142 from the power-on reset circuit 114, a sequence of reading the predefined memory pattern Xn from the memory cell array 102 and successively comparing with contents of the pre-defined content register 116 is performed. The content Fn of the redundant cell array 104 is read and latched in the redundancy cell content register 118. The sequence of reading and comparing the pattern Xn is again executed until the contents are read successfully Mmax times. Any failure during comparing the pattern Xn before reaching the upper limit of Mmax times resets the power validation circuit 120 to an initial state.

Figure 6:
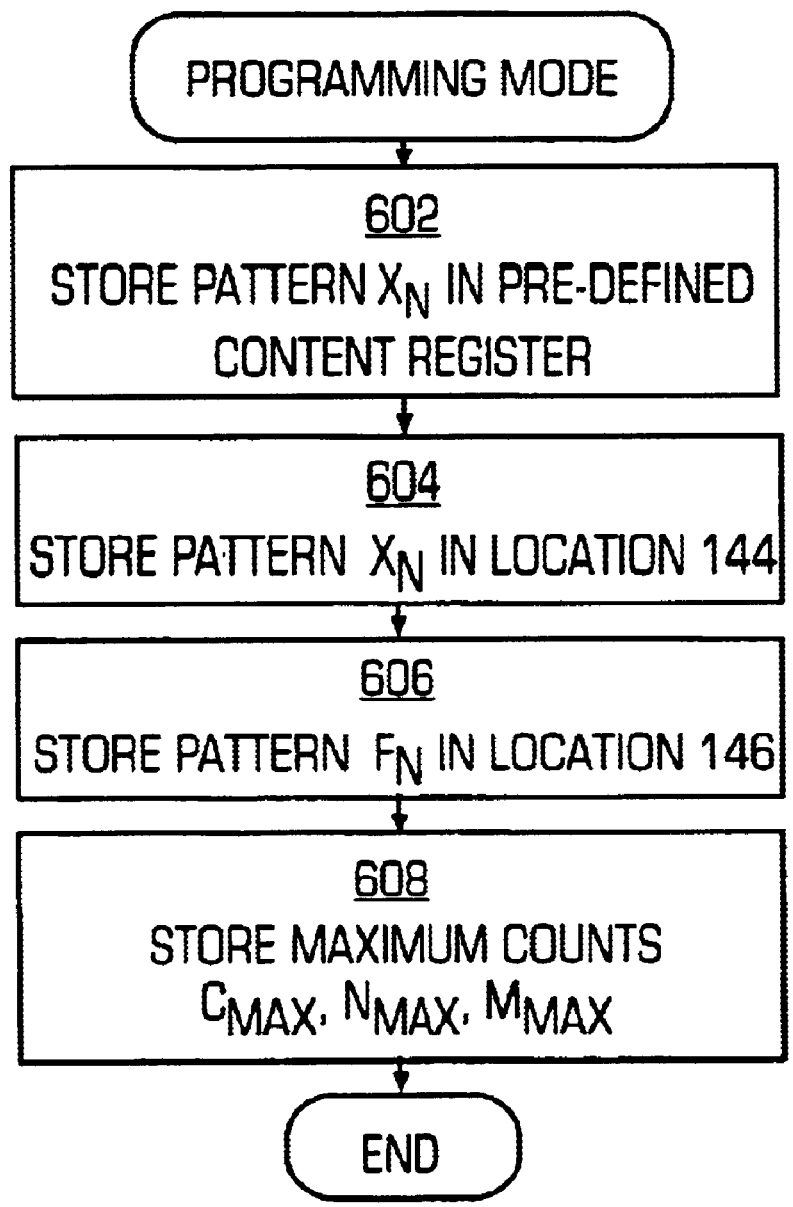
FIG. 6 is a flowchart illustrating an initialization procedure according to the present invention.

At power on, the power-on reset circuit 114 applies the power-on reset signal 142 to the memory 100. The power-on reset signal 142 resets the redundancy read counter 136 to a count of zero (e.g., c=0)(line 202) and resets the cell read pass counter 126 to a count of zero (e.g., m=0)(line 204). The memory cell validation circuit 122 commands a read from the predetermined location 144 of the memory cell array 102 (line 206) and a maximum count value is set in the maximum cell read pass register 130 (e.g., maximum count equals Mmax). (block 208). In another embodiment, the contents of the maximum cell read pass register 130 may be set in an initialization procedure such as shown in FIG. 6.

The sense amplifier 106 provides the read contents from the read predetermined location 144 to the comparator 133 (line 210). The comparator 133 compares the data read from the predetermined location 144 of the memory cell array 102 and the data stored in the predefined content register 116. In the event of a failure (line 212), the comparator 133 provides a signal so that the count of the cell read pass counter 126 is reset (e.g., m=0) (line 204) and the memory location is again read (block 208). On the other hand, in the event of a pass (line 214), the cell read pass counter 126 is incremented by one (e.g., m=m+1), and the comparator 134 determines whether the count m of the cell read pass counter 126 matches the maximum count value (e.g., m=Mmax) in the maximum cell read pass register 130 (block 216). In the event that the cell read pass counter 126 is not equal to the maximum count value, the comparator 134 provides a signal to command another read of the predetermined location at block 208, and the redundant read counter 136 is not incremented (e.g., c=c)(line 218).

On the other hand, in the event that the count m of the cell read pass counter 126 is equal to the maximum count value Mmax in the maximum cell read pass register 130, the redundant read counter 136 is incremented (e.g., c=c+1)(line 228). The comparator 141 compares the count c stored in the redundancy read counter 136 and the maximum count Cmax stored in the maximum redundancy read register 138, and determines whether the count c of the redundancy read counter 136 matches the maximum count value Cmax in the maximum redundancy read register 138 (e.g., c=Cmax) (block 230). In the event of no match, the comparator 141 provides a signal so that the cell read pass count m is reset (line 204) and the memory location is again read (block 208) (line 232). On the other hand, if the count c stored in the redundancy read counter 136 matches the maximum count value Cmax in the maximum redundancy read register 138 (e.g., c=Cmax) and the supply voltage is determined to be valid (line 220) (line 234), the first memory validation procedure is completed, and the memory 100 is ready for normal operation (block 236).

In parallel, the location 146 of the redundant array may be read. A redundancy recall (block 222) is started (line 220). The redundant cell validation circuit 124 commands a read from the predetermined location 146 of the redundant cell array 104 (line 224). The redundant sense amplifier array 108 provides the read contents from the read predetermined location 146 to the redundant cell content register 118 (line 226). In this embodiment, the location 146 is read, but not tested.

In another embodiment, the redundancy recall (elements 222, 224, 226) may be done after the Mmax consecutive reads (block 216). In this embodiment, successful consecutive reads of the predetermined location 144 indicate that the power may be sufficiently high and stable to allow proper reading of the predetermined location 146.

The loop of recalling and comparing the patterns Xn from the location 144 may be repeated the product of Mmax and Cmax before the chip exits the recalling/comparing sequence. In one embodiment, the recall time of the pattern Xn is much longer than the recall time of the pattern Fn in order to secure power turn on or a power glitch, which triggers the power on reset signal 142.

Figure 3:
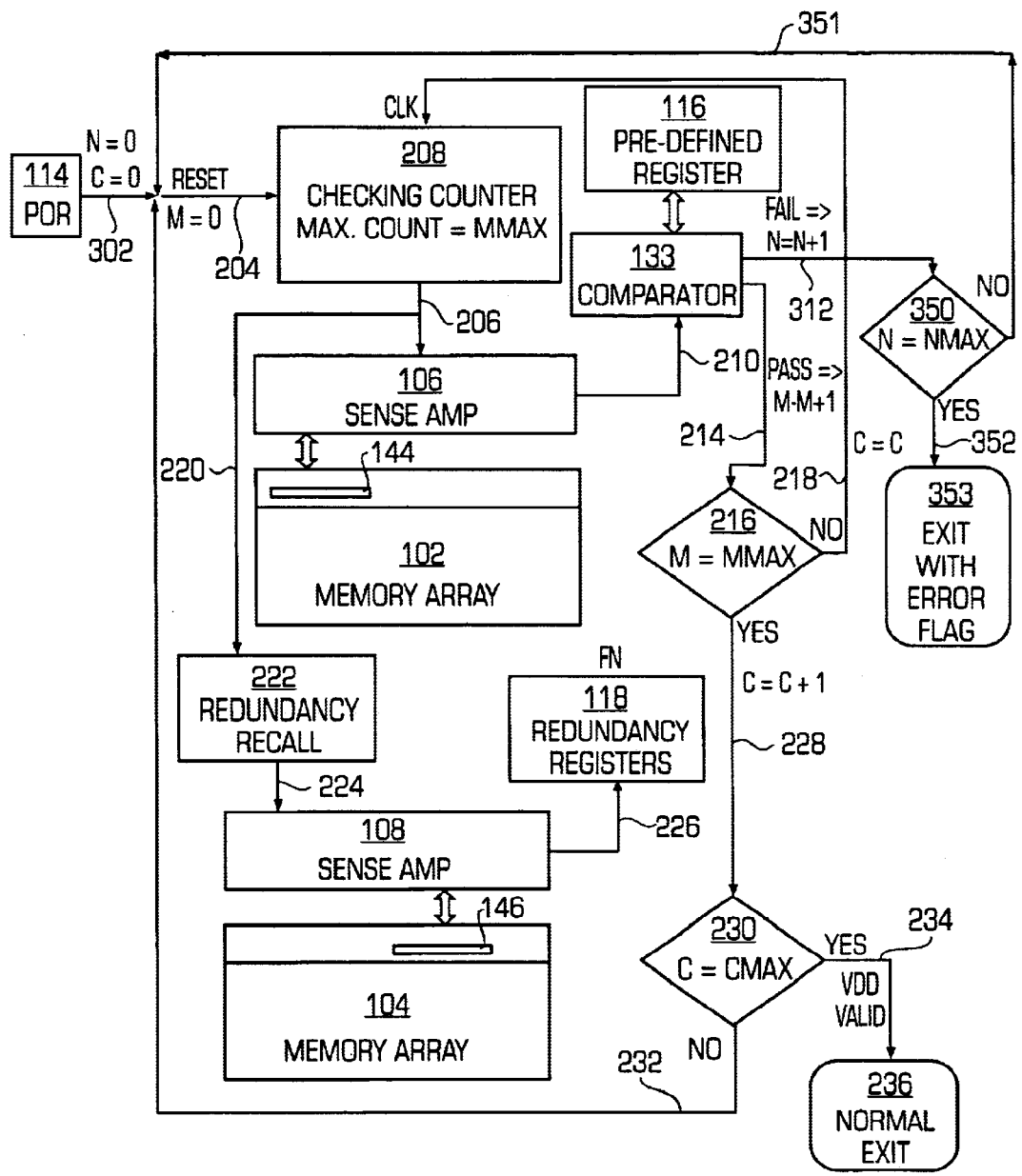
FIG. 3 is a signal control flow diagram illustrating a second memory validation procedure according to the present invention.

FIG. 3 is a signal control flow diagram illustrating a second memory validation procedure according to the present invention. The second memory validation procedure is similar to the first memory validation procedure of FIG. 2. However, the second memory validation procedure further limits a number n of failures during the reading of the memory cell array 102. Like elements of FIG. 3 have like reference numerals as like elements of FIG. 2. To avoid redundancy, description of some features common between the memory validation procedures of FIGS. 2 and 3 are omitted.

The power-on reset signal 142 resets the redundancy read counter 136 to a count of zero (e.g., c=0) and resets the cell read failure counter 128 to a count of zero (e.g., n=0) (line 302). The cell pass counter 126 is reset to a count of zero (e.g., m=0) (line 204). After the read of the memory cell array 102, the comparator 133 compares the data read from the predetermined location 144 and the data stored in the predefined content register 116. In the event of a failure, the number of failures n in the cell read failure counter 128 is incremented by one (e.g., n=n+1) (line 312). A determination is made if the number n of failures equals the maximum number Nmax of failures stored in the maximum cell read failure register 132 (block 350). In the event the number n does not equal the maximum Nmax of failures, the second memory validation procedure continues via the line 204 to the checking counter (line 351). In the event the number of failures n equals the maximum Nmax of failures (line 352), the second memory validation procedure exits and sets an error flag (block 353). In an alternate embodiment, the reset of the cell read failure counter 128 to a count of zero (e.g., n=0) at line 302 may also be done on line 232.

In this embodiment, the maximum number Nmax of read failures is the maximum number of read failures allowed before a number Mmax of consecutive successful reads occurs and the validation stops.

Figure 4:
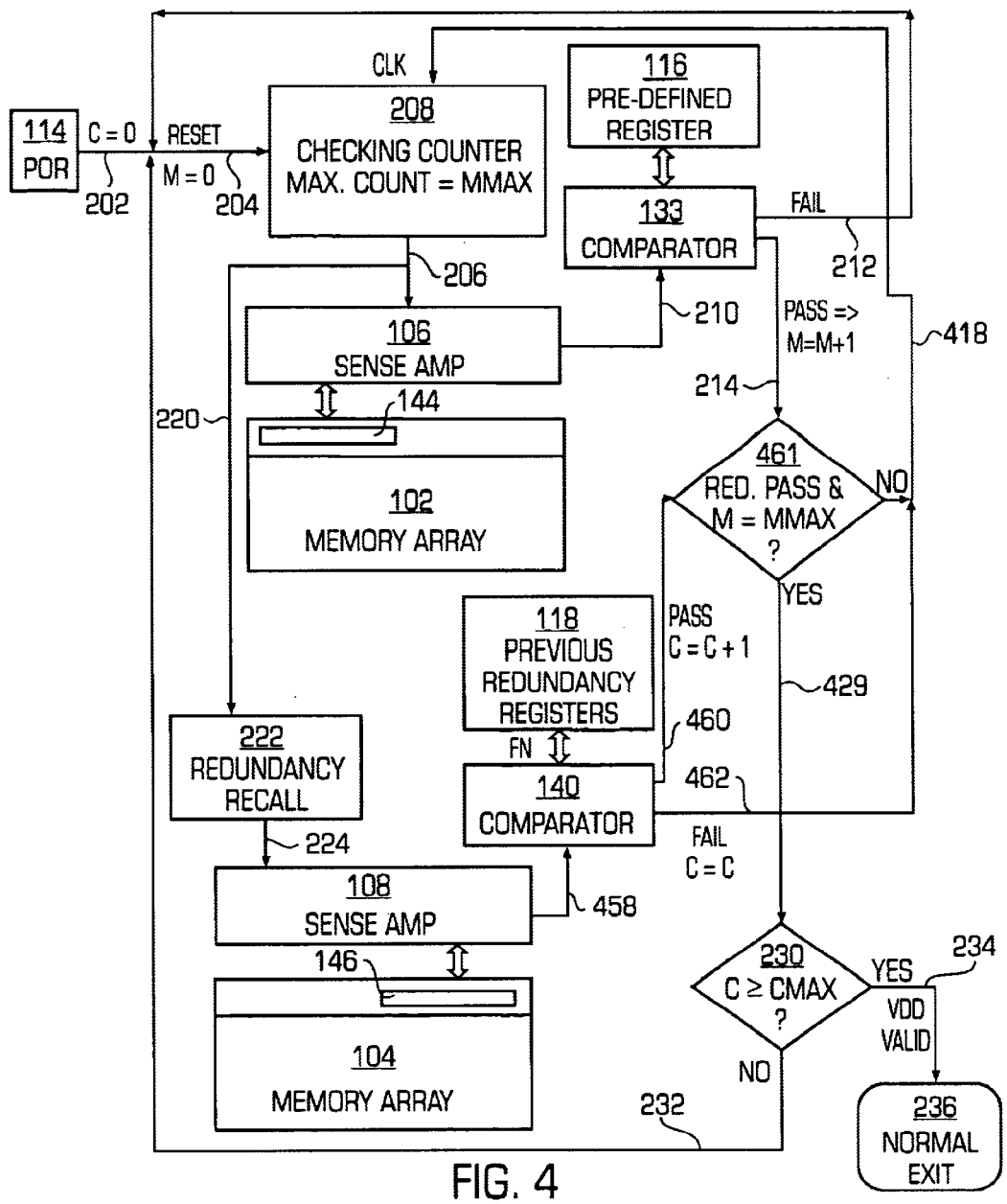
FIG. 4 is a signal control flow diagram illustrating a third memory validation procedure according to the present invention.

FIG. 4 is a signal control flow diagram illustrating a third memory validation procedure according to the present invention. The third memory validation procedure is similar to the first memory validation procedure of FIG. 2. However, the third memory validation procedure further comprises a validation of the read contents of the redundancy cell array 104 and the redundancy read counter 136 is incremented in the event the contents are validated. Like elements of FIG. 4 have like reference numerals as like elements of FIG. 2. To avoid redundancy, description of some features common between the memory validation procedures of FIGS. 2 and 4 are omitted.

The read of the predetermined location 144 is similar to the read in FIG. 2, as described above. However, the result of the comparison by the comparator 133 for a pass on the line 214 is subsequently processed in block 461 as described below. It is noted that block 461 may be reached two ways. The first is from the comparator 133 from the line 214 as described above in conjunction with FIG. 2. The second is by passing a redundancy recall, which is described next.

In parallel to the read of the location 144, the location 146 of the redundancy array 104 may be read. A redundancy recall (block 222) is started (line 220). The redundant cell content register 118 stores the previously read contents read from the redundant cell array 104. The comparator 140 compares the currently read redundant register of the redundant cell array 104 (line 458) to the previously read redundant register stored in the redundant cell content register 118. In the event that the comparator 140 indicates a failure in the comparison of the currently read redundant register via line 458 and the previously read cell stored in the redundant cell content register 118, the number c of redundant cell reads remains the same (e.g., c=c) (line 462) and the memory location is again read (block 208) (line 418). In the event that the comparator 135 indicates a pass in the comparison of the currently read redundant register via line 458 and the previously read cell stored in the redundant cell content register 118, the number c of redundant cell reads is incremented by one (e.g., c=c+1)(line 460) and proceeds to a comparison (block 461). The comparator 134 determines whether the count m of the cell read pass counter 126 matches the maximum count value (e.g., m=Mmax) in the maximum cell read pass register 130 (block 461) (line 214) and determines whether there is a pass from line 460.

In the event that either the redundancy comparison fails or the cell read pass counter 126 is not equal to the maximum count value (e.g., m≠Mmax), the comparator 134 provides a signal to command another read of the predetermined location at block 208 (line 418). In the event that both the redundancy comparison has passed and the cell read pass counter 126 is greater than or equal to the maximum count value (e.g., m≧Max) (block 461)(line 429), a determination is made whether a sufficient number of successful reads of the redundancy location 146 have been made. The comparator 141 compares the count c stored in the redundancy read counter 136 and the maximum count Cmax stored in the maximum redundancy read register 138, and determines whether the count c of the redundancy read counter 136 matches the maximum count value Cmax in the maximum redundancy read register 138 (e.g., c=Cmax) as described above for blocks 230 and 236, and lines 232 and 234.

Figure 5:
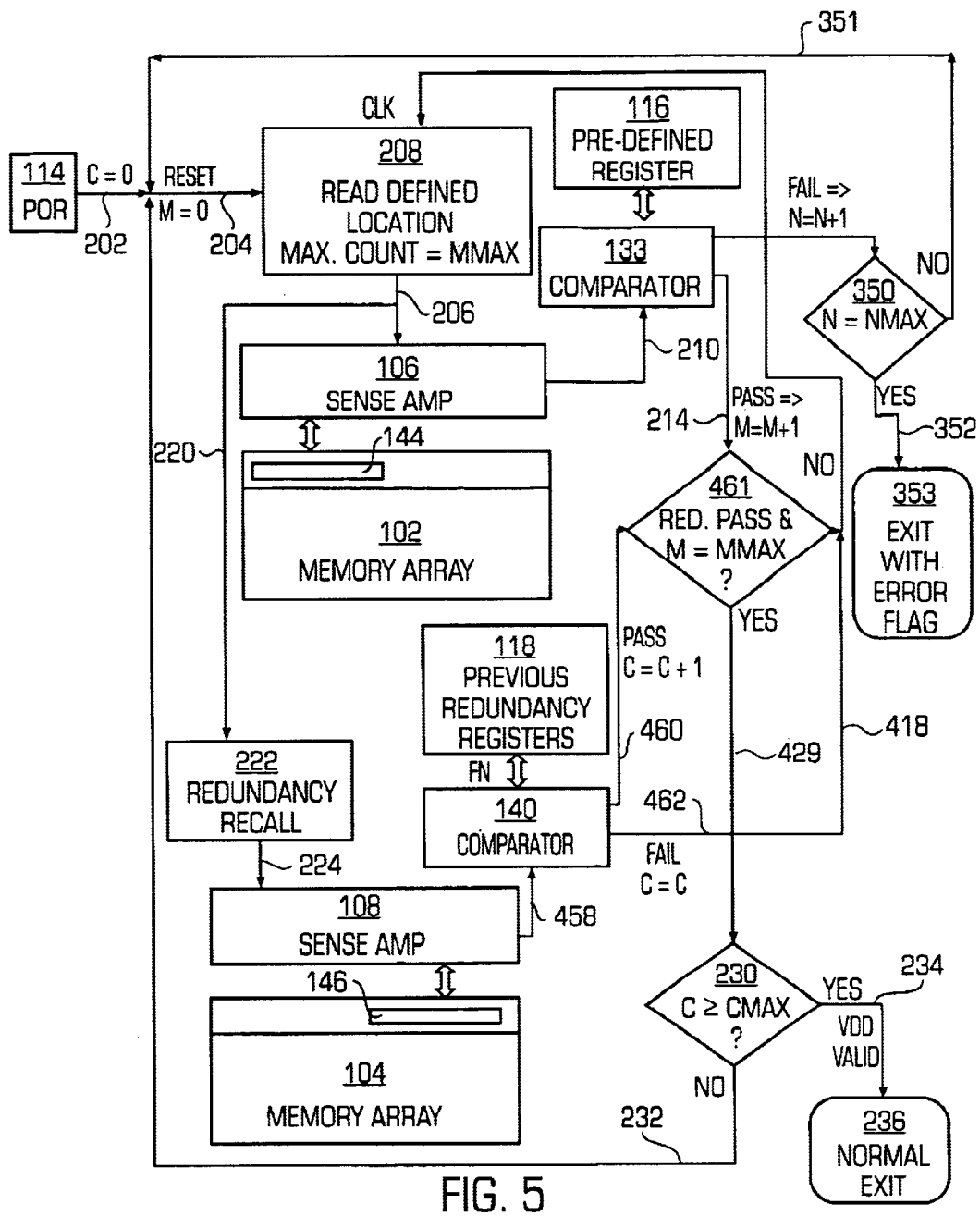
FIG. 5 is a signal control flow diagram illustrating a fourth memory validation procedure according to the present invention.

FIG. 5 is a signal control flow diagram illustrating a fourth memory validation procedure. The fourth memory validation procedure is similar to the third memory validation procedure of FIG. 4, but it further includes the determination of the number n of failures during the reading of the memory cell array 102 of the second memory validation procedure of FIG. 3. In one embodiment, the failure count n of the reads from the memory cell array 102, such as described above in lines 302, 312, 351, and 352 and blocks 350 and 353 in conjunction with FIG. 3, may be combined with the procedure of FIG. 4 to form the fourth memory validation procedure shown in FIG. 5.

In another embodiment, another failure count of reads from the redundant cell array 104 and a limit on the failure count may included in the any of the above memory validation procedures.

FIG. 6 is a flowchart illustrating an initialization procedure according to the present invention. The memory cell array 102 and the redundant cell array 104 may be initialized, for example, in a test mode. The pre-defined memory pattern Xn is stored in the pre-defined content register 116 (block 602). The pre-defined memory pattern Xn is stored in the predetermined location 144 in the memory cell array 102 (block 604). The pattern Fn is stored in the predetermined location 146 in the redundant cell array 104 (block 606). The maximum cell pass count Mmax is stored in the maximum cell read pass register 130, the maximum read failures Nmax is stored in the maximum cell read failure register 132, and the maximum redundancy reads Cmax is stored in the maximum redundancy read register 138 (block 608). Upon power-up, a memory validation procedure, such as described above in conjunction with FIGS. 2, 3, 4, and 5, may be performed on the memory 100.

The memory 100 provides a recall procedure and apparatus to determine the validity of power after a power on reset by testing for successful and successive reads from the memory.

Although the memory 100 and the memory validation procedures have been described in terms of the normal read paths of the memory 100, similar circuits may be included for the reads and validation of the memory.

The memory 100 provides an embedded circuit or software for performing memory recall at initiation, such as power-on or power reset, and validating that initiation is complete by reading the memory and verifying the contents are properly read for successive reads.

Although a memory is described as a stand-alone system, the memory may be included as an embedded memory in other systems, such as a central processing unit or a computer system, or may be included in systems using memory devices.

In this disclosure, there is shown and described only the preferred embodiments of the invention, but, it is to be understood that the invention is capable of use in various other combinations and environments and is capable of changes or modifications within the scope of the inventive concept as expressed herein.

What is claimed is:

1. A method for verifying data stored in a memory, the method comprising:
   receiving an initiation signal;
   reading data stored in a first location of the memory;
   comparing the read data and a predefined data pattern to determine whether there is a match; and
   repeating said reading and comparing in the event that said comparing determines consecutive matches less than a first predetermined number of matches.

2. The method of claim 1 further comprising:
   providing an indication of valid power in the event said comparing determines consecutive matches equal to the first predetermined number of matches.

3. The method of claim 1 further comprising:
   reading data stored in a second location of the memory in the event said comparing determines consecutive matches equal to the first predetermined number of matches.

4. The method of claim 1 further comprising:
   reading data stored in a second location of the memory in the event said comparing determines consecutive matches equal the first predetermined number of matches; and
   repeating said reading data stored in a first location, said comparing, and said reading data stored in a second location a second predetermined number of times.

5. The method of claim 4 further comprising:
   providing an indication of valid power after repeating said reading data stored in a second location said second predetermined number of times.

6. The method of claim 5 further comprising:
   stopping said repeating in the event that said comparing determines that there is not a match a third predetermined number of times.

7. The method of claim 1 further comprising:
   stopping said repeating in the event that said comparing determines that there is not a match a third predetermined number of times.

8. The method of claim 1 further comprising:
   reading data stored in a second location of the memory in the event said comparing determines consecutive matches equal to the first predetermined maximum number of matches;
   comparing said data read from said second location of the memory read data in a previous read and data read from said second location of the memory read data in a current read to determine whether there is a match;
   repeating said reading and comparing in the event that said comparing determines consecutive matches less than a second predetermined maximum number of matches; and
   stopping said repeating in the event that said comparing determines there is not a match the second predetermined number of time.

9. The method of claim 8 wherein the initiation signal is a power reset signal.

10. The method of claim 1 further comprising:
    reading data stored in a second location of the memory in the event said comparing determines consecutive matches equal to the first predetermined number of matches.

11. The method of claim 1 further comprising:
    reading data stored in a second location of the memory; and
    repeating said reading data stored in a first location, said comparing, and said reading data stored in a second location a second predetermined number of times.

12. The method of claim 11 further comprising:
    providing an indication of valid power after repeating said reading data stored in a second location said second predetermined number of times.

13. The method of claim 12 further comprising:
    stopping said repeating in the event that said comparing determines that there is not a match a third predetermined number of times.

14. A method for verifying data stored in a memory, the method comprising:
    receiving a power on reset signal;
    reading data from a first predetermined location of the memory;
    reading a memory pattern from a register;
    comparing the read data and the read memory pattern to determine whether there is a match;
    resetting a read count state in the event there is not a match;
    incrementing said read count state in the event there is a match;
    repeating said reading, comparing, resetting and incrementing in the event the count state is less than a predetermined maximum count value;

reading data from a second predetermined location of the memory;

incrementing a read pass count; and repeating said reading, comparing, resetting and incrementing in the event the read pass count is less than said predetermined maximum count value.

15. The method of claim 14 further comprising:

storing said read data from said second predetermined location of the memory;

comparing said stored read data from previous read and read data from a current read to determine in the event there is a match;

incrementing a match count in the event there is a match;

determining whether said match count equals a maximum count value, and in the event there is a match, generating a read validation indication; and repeating said storing, comparing, incrementing, and determining in the event that there is not a match of the match count.

16. A memory device comprising:

means for storing data;

means for reading data stored in a first location of the means for storing in response to an initiation signal;

means for comparing the read data and a predefined data pattern to determine whether there is a match; and means for repeating said reading and comparing in the event that said comparing determines consecutive matches less than a predetermined number of matches.

17. The memory device of claim 16 further comprising:

means for providing an indication of valid power in the event said comparing determines consecutive matches equal to a predetermined count.

18. The memory device of claim 16 further comprising:

means for reading data stored in a second location of the means for storing in the event said comparing determines consecutive matches equal to the predetermined number of matches.

19. The memory device of claim 16 further comprising:

means for reading data stored in a second location of the means for storing in the event said comparing determines consecutive matches equal to the predetermined number of matches; and means for repeating said reading data stored in a first location, said comparing, and said reading data stored in a second location a predetermined number of times.

20. The memory device of claim 19 further comprising:

means for providing an indication of valid power after said comparing determines consecutive matches equal to a predetermined maximum count.

21. The memory device of claim 16 further comprising:

means for stopping said repeating in the event that said comparing determines that there is not a match a predetermined number of times.

22. The memory device of claim 16 further comprising:

means for reading data stored in a second location of the means for storing in the event said comparing determines consecutive matches equal to the predetermined maximum number of matches;

means for comparing said data read from said second location of said means for storing read data in a previous read and data read from said second location of the means for storing read data in a current read to determine whether there is a match;

means for repeating said reading and comparing in the event that said comparing determines consecutive matches less than a predetermined maximum number of matches; and means for stopping said repeating in the event that said comparing determines there is not a match a predetermined number of time.

23. The memory device of claim 22 wherein the initiation signal is a power reset signal.

24. A memory device comprising:

means for storing data;

means for reading data a predetermined location of the means for storing in response to a power on reset signal;

means for reading a memory pattern from a register;

means for comparing the read data and the read memory pattern to determine whether there is a match;

means for resetting a read count state in the event there is not a match;

means for incrementing said read count state in the event there is a match;

means for repeating said reading, comparing, resetting and incrementing in the event the count state is less than a predetermined maximum count value;

means for reading data from another predetermined location of the means for storing;

means for incrementing a read pass count; and means for repeating said reading, comparing, resetting and incrementing in the event the read pass count is less than said predetermined maximum count value.

25. The memory device of claim 24 further comprising:

means for storing said read data from said another predetermined location of the means for storing data;

means for comparing said stored read data from previous read and read data from a current read to determine whether there is a match;

means for incrementing a match count in the event there is a match; and means for determining whether said match count equals a maximum count value, and in the event there is a match, generating a read validation indication; and means for repeating said method whether there is not a match of the match count.

26. A memory device comprising:

a memory;

a first register storing a predefined data pattern;

a first comparator coupled to the first register and the memory to command a read therefrom and generating a match signal indicating a match in the event the data read from a first location of the memory matches the predefined data pattern and indicating a non-match in the event the data read from the first location does not match the predefined data pattern in response to an initiation signal and;

a first counter coupled to the comparator to cause the first comparator to command a read and generate said match signal in the event that said match signal does not indicate a match for a predetermined number of consecutive reads.

27. The memory device of claim 26 wherein the first counter provides an indication of valid power in the event that a consecutive number of matches equal to the predetermined number of consecutive reads.

28. The memory device of claim 26 further comprising:

a second register to store data read from a second location of the memory.

29. The memory device of claim 26 further comprising:
a second register to store data read from a second location of the memory in the event said first counter determines said predetermined number of consecutive matches.

30. The memory device of claim 26 further comprising:
a second register to store data read from a second location of the memory in the event said counter determines said predetermined number of consecutive matches; and
a second counter to command said first counter to cause said comparator to read and generate said match signal unless said second register reads data stored in the second location a second predetermined number of times.

31. The memory device of claim 29 wherein the second counter provides an indication of valid power in the event said second register reads data stored in the second location a second predetermined number of times.

32. The memory device of claim 26 further comprising:
a third counter counting the number of non-matches of said match signal and commanding said first comparator to stop said read commands in the event said number of non-matches equals a second predetermined number.

33. The memory device of claim 26 further comprising:
a second register to store data read from a second location of the memory in the event said counter determines said predetermined number of consecutive matches; and
a second comparator coupled to the second register and coupled to the memory to receive data read from said second location and generating a comparison signal indicating a match in the event the data read from said second location of the memory read data in a current read matches data read from said second register storing data from the second location in a previous read and indicating a non-match in the event the data read from said second location of the memory read data in a current read does not match data read from said second register storing data from the second location in a previous read;
a second counter to command said first counter to cause said comparator to read and generate said match signal until said second register reads data stored in the second location a second predetermined number of times; and
a third counter counting the number of non-matches of said match signal and commanding said first comparator to stop said read commands in the event said number of non-matches equals a second predetermined number.

34. The memory device of claim 33 wherein the initiation signal is a power reset signal.

35. A method for verifying data stored in a memory, the method comprising:
receiving a power reset signal;
reading data stored in a first location of the memory;
comparing the read data and a predefined data pattern to determine whether there is a match;
reading data stored in a second location of the memory;
comparing said read data stored in said second location and previously read data stored in said second location;
repeating said reading and comparing in the event that said comparing of read data of the first location determines consecutive matches less than a first predetermined number of matches;
resetting said count of consecutive matches in the event that the number of consecutive matches is equal to or greater than said first predetermined number of matches and that said comparing said read data stored in said second location and previously read data stored in said second location match;
repeating said read and comparing of data stored in said second location in the event that said count of consecutive matches is less than said first predetermined number of matches and the number of matches of said comparing said read data stored in said second location and previously read data stored in said second location is less than a second predetermined number of matches.

* * * * *